(12) United States Patent
Horiuchi et al.

(10) Patent No.: US 6,407,460 B1
(45) Date of Patent: Jun. 18, 2002

(54) MULTILAYER CIRCUIT BOARD

(75) Inventors: Michio Horiuchi; Shigeru Mizuno, both of Nagano (JP)

(73) Assignee: Shinko Electric Industries Co., Nagano (JP)

( * ) Notice: Subject to any disclaimer, the term of this patent is extended or adjusted under 35 U.S.C. 154(b) by 0 days.

(21) Appl. No.: 09/616,139

(22) Filed: Jul. 13, 2000

(30) Foreign Application Priority Data

Jul. 22, 1999 (JP) ............................................. 11-207429

(51) Int. Cl.⁷ ............................. H01L 23/52; H05K 7/02
(52) U.S. Cl. ...................... 257/786; 257/698; 257/773; 257/774; 257/776; 174/260; 174/261; 361/772; 361/774; 361/777
(58) Field of Search ................................ 257/773, 776, 257/786, 698, 774; 174/250, 261; 361/774, 773, 772, 777

(56) References Cited

U.S. PATENT DOCUMENTS

| | | | | |
|---|---|---|---|---|
| 5,444,303 A | * | 8/1995 | Greenwood et al. | 257/786 |
| 5,677,575 A | * | 10/1997 | Maeta et al. | 257/778 |
| 5,784,262 A | | 7/1998 | Sherman | 361/777 |
| 6,008,543 A | * | 12/1999 | Iwabuchi | 257/778 |
| 6,107,685 A | * | 8/2000 | Nishiyama | 257/737 |
| 6,194,668 B1 | * | 2/2001 | Horiuchi et al. | 174/261 |
| 6,215,184 B1 | * | 4/2001 | Stearns et al. | 257/738 |
| 6,242,815 B1 | * | 6/2001 | Hsu et al. | 257/786 |

FOREIGN PATENT DOCUMENTS

| | | |
|---|---|---|
| EP | 898 311 A2 | 1/1999 |
| JP | A-11-186332 | 7/1999 |

* cited by examiner

*Primary Examiner*—Cathy Lam
(74) *Attorney, Agent, or Firm*—Pennie & Edmonds LLP

(57) ABSTRACT

The present invention provides a multilayer circuit board for mounting thereon a semiconductor chip or other electronic elements having electrode terminals or other connection terminals which are arranged in a grid, staggered, or close-packed manner in an improved form to enable reduction in the number of the wiring layers for lead wiring lines, thereby facilitating the production of multilayer circuit boards and providing an improved product reliability. The multilayer circuit board comprises: a base board having a mounting surface for mounting thereon a semiconductor chip and/or other electronic elements having lattice-arranged connection terminals; connection terminal pads arranged on the mounting surface to form a plane lattice corresponding to the lattice arrangement of the connection terminals and having lattice sites each occupied by one of the connection terminal pads; lead wiring lines lying on the mounting surface and having one end connected to the connection terminal pads and the other end extending outwardly from the plane lattice; and the said plane lattice having a peripheral zone including periodic vacant lattice areas formed by vacant lattice sites occupied by no connection terminal pads.

6 Claims, 4 Drawing Sheets

(a)

(b)

(c)

MULTILAYER CIRCUIT BOARD

BACKGROUND OF THE INVENTION

1. Field of the Invention

The present invention relates to a multilayer circuit board, for mounting thereon a semiconductor chip and/or other electronic elements, having lattice-arranged connection terminals and to a semiconductor device including the multilayer circuit board having a semiconductor chip and/or other electronic elements mounted thereon.

2. Description of the Related Art

FIG. 8 shows a semiconductor device composed of a monolayer circuit board 5 provided with a semiconductor chip 4 mounted thereon by flip-chip bonding. The semiconductor chip 4 has a electrode terminal carrying surface 2 having a peripheral area in which electrode terminals 6 are arranged in one row or line and are electrically connected to one end of the lead wiring lines 7 lying on the circuit board 5.

FIG. 9 shows a plane arrangement of the lead wiring lines 7 and connection terminal pads 8 arranged in two rows or lines on the circuit board 5. The connection terminal pads 8 have the same plane arrangement as that of the electrode terminals 6 of the semiconductor chip 4. The connection terminal pads 8 on the outermost line have the lead wiring lines 7 directly extending outward and the other connection terminals 8 have the lead wiring lines 7 outwardly extending through a space between neighboring connection terminal pads 8 on the outer most line.

FIG. 10 shows a semiconductor device composed of a multilayer circuit board 50 including four circuit boards 5a to 5d, and a semiconductor chip 4 mounted thereon and having many rows or lines of electrode terminals 6. Lead wiring lines 7 are disposed on separate layers 5a to 5d to avoid interference therebetween. The four circuit boards 5a to 5d having respective lead wiring lines 7 formed thereon are laminated to provide electrical connection of all the electrode terminals 5 to external connection terminals 9. The lead wiring lines 7 are composed of lateral portions 7a lying on the circuit boards 5a to 5d and via portions 7b penetrating through one or more of the circuit boards 5a to 5d, in which the vias 7b provide electrical connection from the electrode terminals 6 to the lateral portions 7a or from the lateral portions 7a to the external connection terminals 9.

On the electrode terminal carrying surface 2 of the semiconductor chip 4, the electrode terminals 6 are usually arranged in a grid form, a staggered form, a close-packed form or the like, which can be collectively referred to as a lattice arrangement. A circuit board for mounting a semiconductor chip 4 thereon has connection terminal pads 8 formed thereon in an arrangement corresponding to that of the electrode terminals 6 on the electrode terminal carrying surface 2 of the semiconductor chip 4, in which the distance or space between neighboring connection terminal pads 8 is determined so that at least one of the lead wiring lines 7 can run through the space.

Upgrading of the semiconductor chip requires an increased number of input/output terminals or connection terminals and an increased number or density of the connection terminal pads 8.

FIG. 11 shows actual pad arrangements, i.e., (a) a grid form, (b) a staggered form and (c) a close-packed form. The nearest neighboring pads 8 have a space s therebetween. The space s must be sufficiently large to allow at least one of the lead wiring lines 7 to run therethrough. On the other hand, the space s is desirably as small as possible to provide an increased density of the pads 8 for an increased number of input/output terminals of a semiconductor chip. The lower limit of the space s also depends on a process tolerance which can be stably achieved in the production process.

If the pads 8 are arranged with a space s as small as the process tolerance, none of the lead wiring lines 7 can run through the space s. Namely, although lead wiring lines 7 can directly extend from the pads 8 on the outermost line of the lattice, additional wiring layers are necessary to enable lead wiring lines 7 to extend from the pads 8 on the inner lines of the lattice to avoid interference between lead wiring lines. This undesirably increases the number of wiring layers, which should be reduced to achieve an improved production efficiency.

An increase in the number of the wiring layers also causes a problem in the product yield, the product reliability and the production cost. Although an increased number of wiring layers can be achieved by a build-up process or the like, the technological difficulty is increased with the increase in the number of wiring layers, which involves an additional problem of ensuring the interlayer electrical connection while ensuring an improved wiring density in the respective layers, including good electrical connection over the entire wiring as a whole.

SUMMARY OF THE INVENTION

An object of the present invention is to provide a multilayer circuit board for mounting thereon a semiconductor chip or other electronic elements having electrode terminals or other connection terminals which are grid- or stagger-arranged in an improved form to enable reduction in the number of the wiring layers for lead wiring lines, thereby facilitating the production of multilayer circuit boards and providing an improved product reliability.

Another object of the present invention is to provide a semiconductor device using the improved multilayer circuit board.

To achieve the object according to the present invention, there is provided a multilayer circuit board comprising:

a base board having a mounting surface for mounting thereon a semiconductor chip and/or other electronic elements having lattice-arranged connection terminals;

connection terminal pads arranged on the mounting surface to form a plane lattice corresponding to the lattice arrangement of the connection terminals and having lattice sites each occupied by one of the connection terminal pads;

lead wiring lines lying on the mounting surface and having one end connected to the connection terminal pads and the other end extending outward from the plane lattice; and the said plane lattice having a peripheral zone including periodic vacant lattice areas formed by vacant lattice sites occupied by no connection terminal pads.

According to a preferred embodiment, the vacant lattice areas have an open outer side and a closed inner side defined by the connection terminal pads in a number of r defined by:

$$r = b(d+s)/(w+s), \ d>s \text{ and } d>w;$$

where b is a number of vacant lattice sites occupied by no connection terminal pads on the open outer side, d is a diameter of the pads, w is a width of the lead wiring lines and s is a distance between neighboring pads and is also a distance between neighboring lead wiring lines, said r connection terminal pads each having a lead wiring line having one end connected thereto and the other end extending outward from the plane lattice.

Typically, the vacant lattice areas are in the form of a triangle or a trapezoid having a base defined by an outermost line of the vacant lattice sites.

The present invention also provides a semiconductor device comprising the above-specified multilayer circuit board having a semiconductor chip and/or other electronic elements mounted thereon by area-array bonding.

DESCRIPTION OF THE PREFERRED EMBODIMENTS

According to a preferred embodiment of the present invention, a multilayer circuit board has connection terminal pads arranged in the form of a close packed plane lattice at spaces therebetween that are as small as the process tolerance to provide as high a density of connection terminal pads as practically possible, in which no lead wiring lines can directly extend through the spaces, from pads on the inner lines of the plane lattice outward from the plane lattice. According to the present invention, the provision of vacant lattice areas in the peripheral zone of the plane lattice enables lead wiring lines to directly extend outward from pads on the inner lines of the plane lattice.

Figure 1:
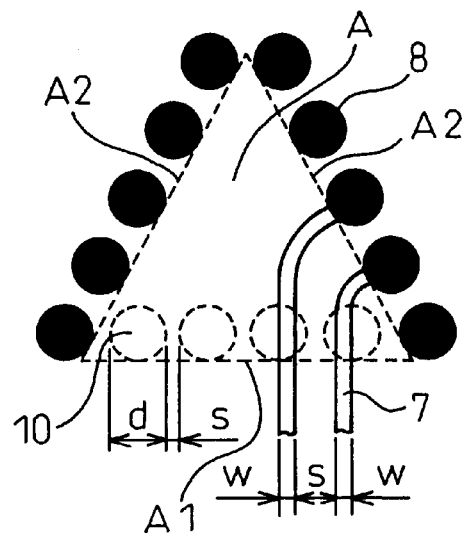
FIG. 1 is a plan view showing an arrangement of connection terminal pads with lead wiring lines extending therefrom on a multilayer circuit board according to the present invention.

FIG. 1 is a partial plan view of an arrangement of connection terminal pads 8 and lead wiring lines 7 on a multilayer circuit board of a preferred embodiment of the present invention. A plane lattice (not shown) of pads 8 in the peripheral zone has a vacant lattice area A formed by vacant lattice sites 10 (only sites on the outermost line shown) occupied by no pads. The vacant lattice area A has an open outer side A1 and a closed inner side A2 defined by the connection terminal pads 8 in a number r defined by the formula described below so that lead wiring lines 7 can extend from all the connection terminal pads 8 defining the closed inner side A2 of the vacant lattice area A.

The number r of lead wiring lines 7 which can extend outward through the open outer side A1 of the vacant lattice area A is defined by the following formula:

$$r=b(d+s)/(w+s),$$

where b is the number of vacant lattice sites 10 occupied by no connection terminal pads 8 on the open outer side A1, d is the diameter of the pads 8, w is the width of the lead wiring lines 7 and s is the distance between neighboring pads 8 or between neighboring lead wiring lines 7.

In a close packed plane lattice, the space s between neighboring pads 8 or between neighboring lead wiring lines 7 is as small as the process tolerance or the lower limit which can be stably achieved by the production process, i.e., pads 8 or lead wiring lines 7 cannot practically be disposed at intervals smaller than the space s.

The formula means that r lead wiring lines can extend from a vacant lattice area having an open outer side including b vacant lattice sites, i.e., that a vacant lattice area may be designed to have a closed inner side defined by a line of r pads from which lead wiring lines can extend through an open outer side defined by a line of b vacant lattice sites.

It will be readily recognized by a skilled person that the provision of the vacant lattice area is only effective when the number r of lead wiring lines which can directly extend from the vacant lattice area is greater than the number b of vacant lattice sites on the open outer side of the vacant lattice area.

This relationship between the numbers r and n also means that the space between pads of the plane lattice is minimized to the process tolerance or practically acceptable limit and provides the most efficient extension of lead wiring lines from pads.

The vacant lattice area is not limited to have a triangular shape as shown in FIG. 1 but may have any other shape. The plane lattice area may be a grid form, a staggered form, a close-packed form, or another form.

The multilayer circuit board according to the present invention may mount thereon a semiconductor chip and/or other electronic elements including a surface mount-type semiconductor device having a large number of grid- or stagger-arranged connection terminals. The term "connection terminal" used herein collectively refers to the electrode terminals of a semiconductor chip and also to the connection terminals of other electronic elements.

EXAMPLES

Figure 2:
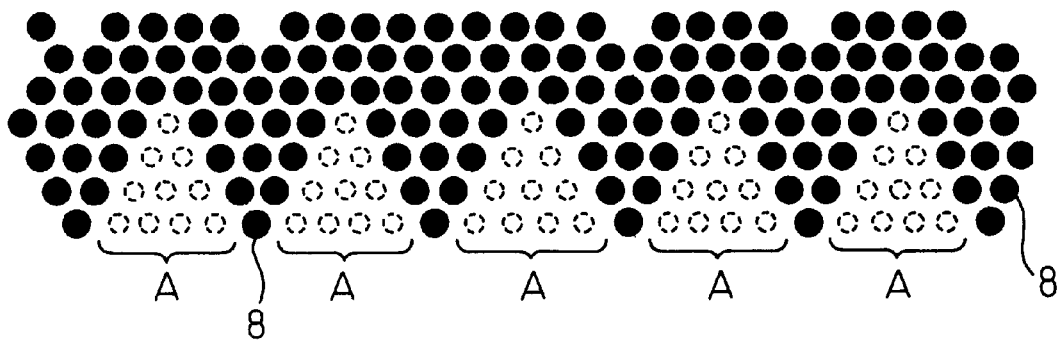
FIG. 2 is a plan view showing an arrangement of connection terminal pads forming a close packed plane lattice having a peripheral zone including periodic vacant lattice areas in the form of a triangle with the base defined by four vacant lattice sites according to the present invention.

FIG. 2 is a plan view of a close-packed plane lattice of connection terminal pads 8, according to the present invention, in which the lattice in the peripheral zone has periodic vacant lattice areas A having vacant lattice sites occupied by no pads 8. The vacant lattice areas A have a triangular shape with the base defined by the vacant lattice sites on the outermost line of the plane lattice. A semiconductor chip or other electronic elements to be mounted on the multilayer circuit board of the present invention has electrode terminals or connection terminals arranged in a plane lattice form including vacant lattice sites corresponding to the plane lattice and vacant lattice sites of the multilayer circuit board.

Figure 3:
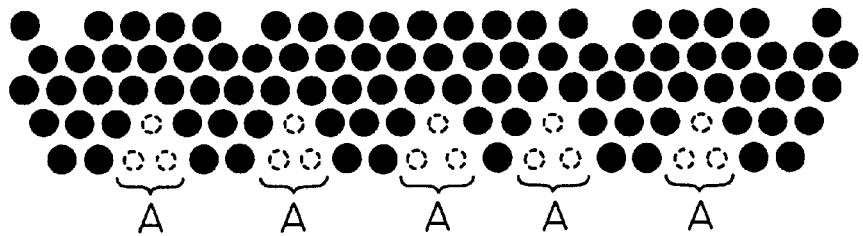
FIG. 3 is a plan view showing another arrangement of connection terminal pads forming a close packed plane lattice having a peripheral zone including periodic vacant lattice areas in the form of a triangle with the base defined by two vacant lattice sites according to the present invention.

The vacant lattice areas A shown in FIG. 2 have a triangular shape with the base defined by four vacant lattice sites on the outermost line of the plane lattice. The number of vacant lattice sites may vary with the desired size of the vacant lattice area A, as exemplified in FIG. 3 in which triangular vacant lattice areas A have a base defined by two vacant lattice sites.

Figure 4:
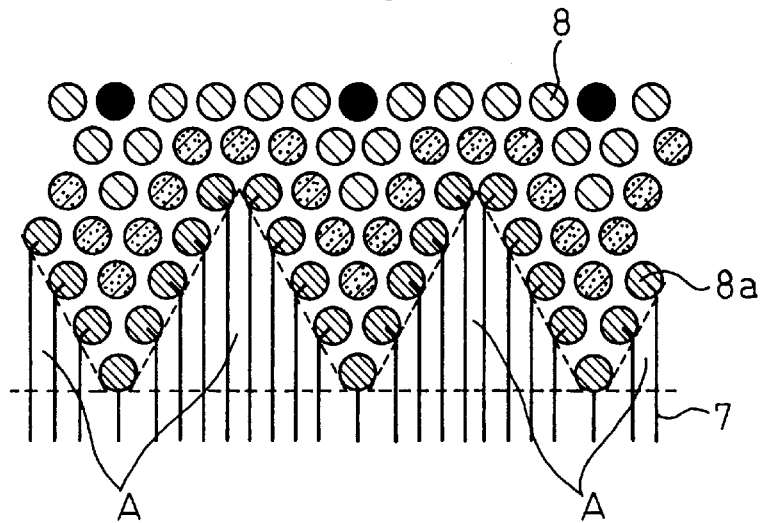
FIG. 4 is a plan view showing a preferred embodiment of a close-packed plane lattice of connection terminals with lead wiring lines extending therefrom through periodic triangular vacant lattice areas on a first or top wiring layer of a multilayer circuit board according to the present invention.
Figure 5:
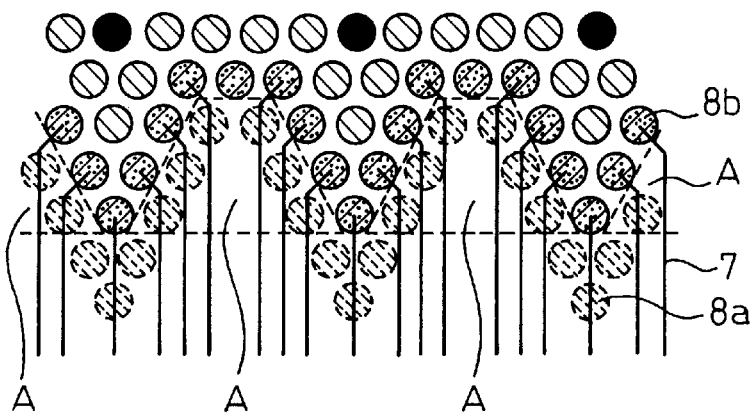
FIG. 5 is a plan view showing a close packed plane lattice of connection terminal pads with lead wiring lines extending therefrom through periodic trapezoidal vacant lattice areas on a second wiring layer of the multilayer circuit board shown in FIG. 4.
Figure 6:
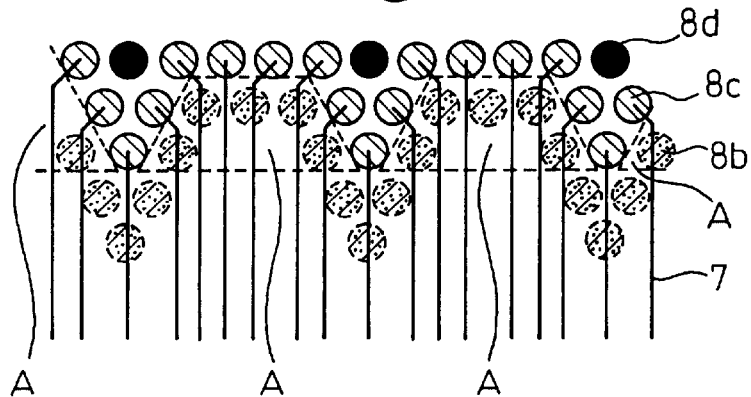
FIG. 6 is a plan view showing a close packed plane lattice of connection terminal pads with lead wiring lines extending therefrom through periodic trapezoidal vacant lattice areas on a third wiring layer of the multilayer circuit board shown in FIG. 5.

FIGS. 4 to 6 show laminated wiring layers each having a plane lattice of connection terminal pads of a multilayer circuit board according to a preferred embodiment of the present invention. The wiring layers have respective plane lattices of connection terminal pads 8, in which the lattices have correspondingly positioned lattice sites, i.e., the corresponding lattice sites of the different wiring layers are aligned with each other along a line normal to the surface of the circuit board.

FIG. 4 shows the first or top wiring layer on which a semiconductor chip is mounted. A close-packed plane lattice of connection terminal pads 8 has a peripheral zone in which triangular vacant lattice areas A are periodically disposed and have a closed inner side defined by the connection terminal pads 8a forming an outermost profile line of the plane lattice. Lead wiring lines 7 can outwardly extend from all of the pads 8a through a space provided by the triangular vacant lattice area A of the first layer.

FIG. 5 shows the second wiring layer lying immediately under the first layer. A close-packed plane lattice of connection terminals 8 has a peripheral zone in which trapezoidal vacant lattice areas A are periodically disposed and have a closed inner side defined by the connection terminal pads 8b forming a profile line immediately inside the outermost profile line of the first layer. Lead wiring lines 7 can outwardly extend from all of the pads 8b through a space provided by the trapezoidal vacant lattice area A of the second layer.

FIG. 6 shows the third wiring layer lying immediately under the second layer. A close-packed plane lattice of connection terminal pads 8 has a peripheral zone in which trapezoidal vacant lattice areas A are periodically disposed and have a closed inner side defined by the connection terminal pads 8c forming a profile line immediately inside the profile line of the second layer. Lead wiring lines 7 can outwardly extend from all of the pads 8c through a space provided by the trapezoidal vacant lattice are A of the third layer.

The triangular and trapezoidal shapes of the vacant lattice areas A advantageously enable lead wiring lines 7 to extend from all of the connection terminal pads 8 forming the profile line of the plane lattice.

Referring to FIG. 6, the pads 8d are left free of lead wiring lines 7 extending therefrom on the third layer and may have lead wiring lines 7 extending therefrom on the next layer.

Further inner pads (not shown) also may have lead wiring lines extending therefrom on the subsequent layers, and if the number thereof is not large, lead wiring lines may extend from outermost pads in a conventional manner used in a close packed arrangement of connection terminal pads.

Figure 7:
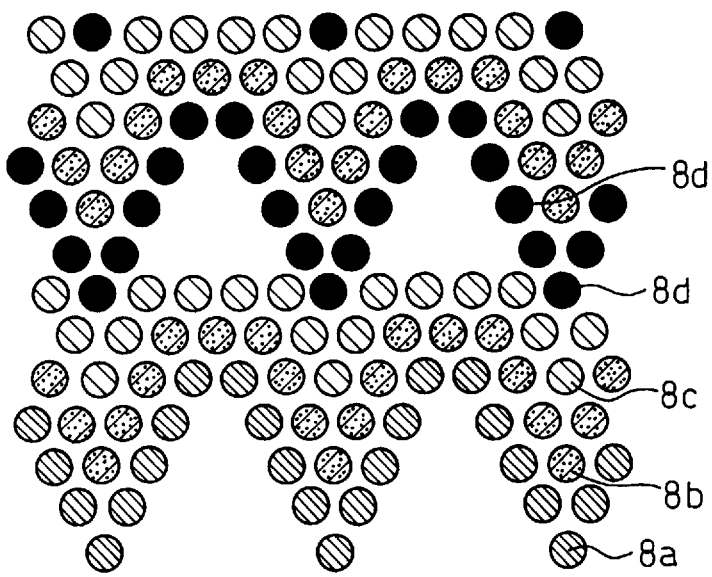
FIG. 7 is a plan view showing a close packed plane lattice of connection terminal pads in which the triangular and trapezoidal vacant lattice areas are also provided on the further wiring layers lying under the third layer of FIG. 6.
Figure 8:
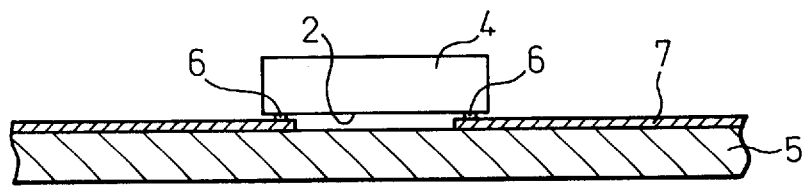
FIG. 8 is a cross-sectional view showing a conventional semiconductor device composed of a monolayer circuit board with a semiconductor chip mounted thereon by flip-chip bonding.
Figure 9:
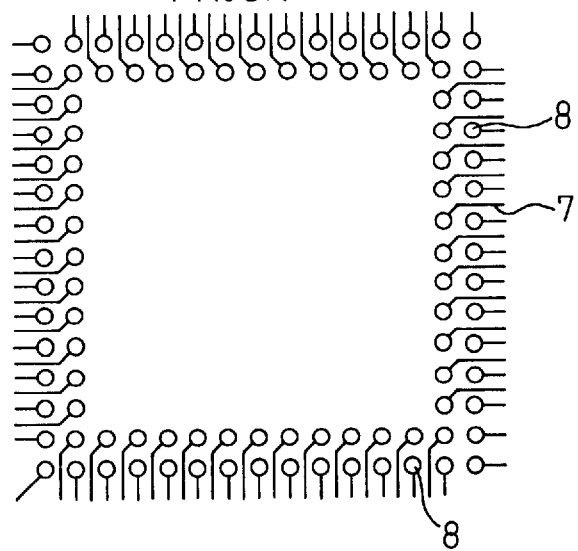
FIG. 9 is a plan view showing a plane arrangement of lead wiring lines and connection terminal pads arranged in two rows or lines on the circuit board shown in FIG. 8.
Figure 10:
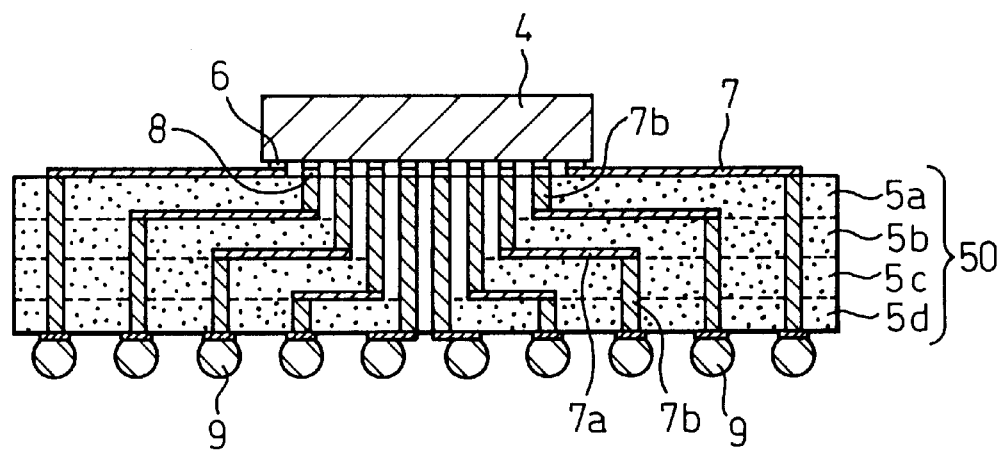
FIG. 10 is a cross-sectional view showing a semiconductor device composed of a multilayer circuit board including four circuit boards and a semiconductor chip 4 mounted thereon.
Figure 11:
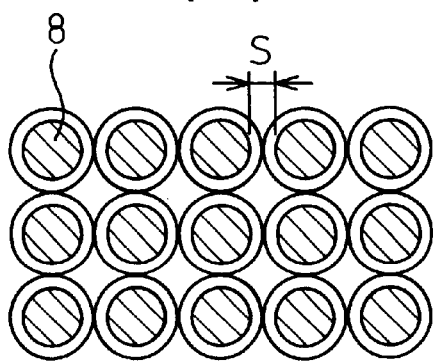
FIG. 11 is a plan view showing usual pad arrangements including (a) a grid form, (b) a stagger form and (c) a close packed form.
Figure 11:
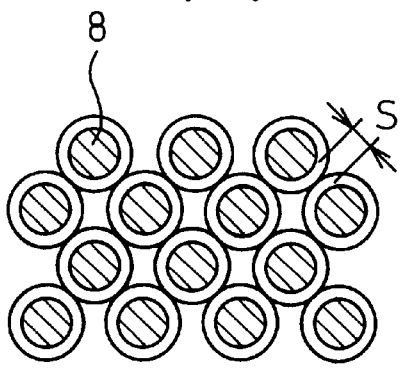
Figure 11:
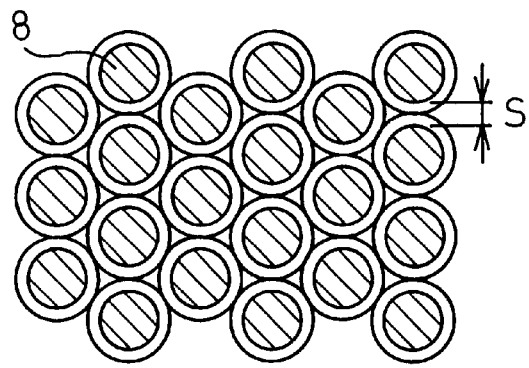

FIG. 7 shows another embodiment in which the plane lattices on the subsequent layers also have a peripheral zone in which vacant lattice areas are periodically disposed as in the preceding layers described above. In this embodiment, the pads 8d form the closed inner side of vacant lattice areas on the fourth wiring layer. Lead wiring lines 7 can outward extend from all of the pads 8d through a space provided by a triangular vacant lattice area. On the fifth and further layers, lead wiring lines can outward extend in the same manner as described above referring to FIGS. 5 and 6.

The provision of triangular or trapezoidal vacant lattice areas on a close packed plane lattice of connection terminals advantageously provides an increased number of effective pads from which lead wiring lines can outwardly extend in comparison with the conventional close packed plane lattice in which lead wiring lines can only extend outwardly from outermost pads on a linear profile line of the plane lattice.

The herein described preferred embodiments do not only apply to a close packed pad arrangement but also apply to grid or stagger arrangement of connection terminal pads.

According to this embodiment, there is also provided a semiconductor device in which a semiconductor chip 4 or other electronic element is bonded to the mounting surface of the present inventive multilayer circuit board with the connection terminals of the electronic element being aligned with the pads 8 of the board and the pads 8 are electrically connected to the lateral portions of the lead wiring lines 7 through the via portions 7b so that the semiconductor chip or other electronic element is electrically connected to external connection terminals of the multilayer circuit board for mounting on a motherboard. The multilayer circuit board may be produced by forming lead wiring lines 7, pads 8 and vias 7b by build-up process or the like to provide electrical interconnection between layers.

As herein described, the present invention provides a multilayer circuit board in which extension of lead wiring lines from connection terminal pads is most effectively achieved even when the pads are disposed at a minimum space as small as a process tolerance so that the multilayer circuit board has a number of wiring layers minimized to facilitate production thereof and provide an improved reliability of the product.

The present invention also provides a compact and reliable semiconductor device composed by mounting on the multilayer circuit board of the present invention a semiconductor chip and/or other electronic element.

What is claimed is:

1. A multilayer circuit board comprising:
   a base board, having a mounting surface for mounting thereon at least one of a semiconductor chip or an electronic element, having lattice-arranged connection terminals;
   connection terminal pads arranged on the mounting surface to form a plane lattice corresponding to the lattice arrangement of the connection terminals and having lattice sites each occupied by one of the connection terminal pads;
   lead wiring lines disposed on the mounting surface and having one end connected to the connection terminal pads and the other end extending outward from the plane lattice, wherein said plane lattice has a peripheral zone including periodic vacant lattice areas formed by vacant lattice sites occupied by no connection terminal pads;

and wherein the vacant lattice areas have an open outer side and a closed inner side defined by the connection terminal pads in a number of r defined by:

$$r = b(d+s)/(w+s); \ d > s \text{ and } d > w;$$

where b is a number of vacant lattice sites occupied by no connection terminal pads on the open outer side, d is a diameter of the pads, w is a width of the lead wiring lines and s is a distance between neighboring pads and is also a distance between neighboring lead wiring lines, said r connection terminal pads each having a lead wiring line having one end connected thereto and the other end extending outward from the plane lattice.

2. A multilayer circuit board according to claim 1, wherein the vacant lattice areas are in the form of a triangle or a trapezoid having a base defined by an outermost line of the vacant lattice sites.

3. A semiconductor device comprising a multilayer circuit board having at least one of a semiconductor chip or an electronic element mounted thereon by area-array bonding, wherein said multilayer circuit board comprises:

a base board having a mounting surface having lattice-arranged connection terminals for mounting thereon at least one of the semiconductor chip or an electronic element;

connection terminal pads arranged on the mounting surface to form a plane lattice corresponding to the lattice arrangement of the connection terminals and having lattice sites each occupied by one of the connection terminal pads, said plane lattice having a peripheral zone including periodic vacant lattice areas formed by vacant lattice sites occupied by no connection terminal pads;

lead wiring lines disposed on the mounting surface and having one end connected to the connection terminal pads and the other end extending outward from the plane lattice;

wherein the vacant lattice areas have an open outer side and a closed inner side defined by the connection terminal pads in a number of r defined by:

$$r = b(d+s)/(w+5); \ d > s \text{ and } d > w;$$

where b is a number of vacant lattice sites occupied by no connection terminal pads on the open outer side, d is a diameter of the pads, w is a width of the lead wiring lines and s is a distance between neighboring pads and is also a distance between neighboring lead wiring lines, said r connection terminal pads each having a lead wiring line having one end connected thereto and the other end extending outward from the plane lattice.

4. A semiconductor device according to claim 3, wherein the vacant lattice areas are in the form of a triangle or a trapezoid having a base defined by an outermost line of the vacant lattice sites.

5. A multilayer circuit board comprising:

a base board, having a mounting surface for mounting thereon at least one of a semiconductor chip or an electronic element, having lattice-arranged connection terminals;

connection terminal pads arranged on the mounting surface to form a plane lattice corresponding to the lattice arrangement of the connection terminals and having lattice sites each occupied by one of the connection terminal pads;

lead wiring lines disposed on the mounting surface and having one end connected to the connection terminal pads and the other end extending outward from the plane lattice, said plane lattice has a peripheral zone including periodic vacant lattice areas formed by vacant lattice sites occupied by no connection terminal pads;

wherein the vacant lattice areas are in the form of a triangle or a trapezoid having a base defined by an outermost line of the vacant lattice sites.

6. A semiconductor device comprising a multilayer circuit board having at least one of a semiconductor chip or an electronic element mounted thereon by area-array bonding, wherein said multilayer circuit board comprises:

a base board having a mounting surface for mounting thereon at least one of the semiconductor chip or an electronic element having lattice-arranged connection terminals;

connection terminal pads arranged on the mounting surface to form a plane lattice corresponding to the lattice arrangement of the connection terminals and having lattice sites each occupied by one of the connection terminal pads, said plane lattice having a peripheral zone including periodic vacant lattice areas formed by vacant lattice sites occupied by no connection terminal pads;

lead wiring lines lying on the mounting surface and having one end connected to the connection terminal pads and the other end extending outward from the plane lattice; wherein the vacant lattice areas are in the form of a triangle or a trapezoid having a base defined by an outermost line of the vacant lattice sites.

* * * * *

UNITED STATES PATENT AND TRADEMARK OFFICE
CERTIFICATE OF CORRECTION

PATENT NO. : 6,407,460 B1
DATED : June 18, 2002
INVENTOR(S) : Horiuchi et al.

It is certified that error appears in the above-identified patent and that said Letters Patent is hereby corrected as shown below:

Title page,
Item [73], Assignee, please change "Shinko Electric Industries Co." to -- Shinko Electric Industries Co., Ltd. --.

Signed and Sealed this

Twenty-first Day of January, 2003

JAMES E. ROGAN
*Director of the United States Patent and Trademark Office*